US006618239B2

(12) United States Patent
Takahashi et al.

(10) Patent No.: US 6,618,239 B2
(45) Date of Patent: Sep. 9, 2003

(54) KEY SWITCH AND KEYBOARD

(75) Inventors: Kouki Takahashi, Kawasaki (JP); Kouji Ishikawa, Kawasaki (JP); Kiyokazu Moriizumi, Kawasaki (JP); Kiyoshi Wada, Kawasaki (JP); Katsumi Harada, Shinagawa (JP); Junichi Maruyama, Shinagawa (JP); Yasuo Yatsuda, Shinagawa (JP); Kazutoshi Hayashi, Shinagawa (JP); Toshiaki Tanaka, Hachioji (JP)

(73) Assignees: Fujitsu Limited, Kawasaki (JP); Nagano Fujitsu Component Limited, Nagano (JP)

( * ) Notice: Subject to any disclaimer, the term of this patent is extended or adjusted under 35 U.S.C. 154(b) by 0 days.

(21) Appl. No.: 10/068,003

(22) Filed: Feb. 8, 2002

(65) Prior Publication Data

US 2002/0185364 A1 Dec. 12, 2002

(30) Foreign Application Priority Data

Jun. 7, 2001 (JP) ....................................... 2001-172935

(51) Int. Cl.[7] ............................ H05K 7/00; H01H 9/00; H01H 13/705

(52) U.S. Cl. ....................... 361/679; 200/5 R; 200/5 A; 200/344

(58) Field of Search ................................ 200/5 R, 5 A, 200/512–517, 329–345; 361/679–687

(56) References Cited

U.S. PATENT DOCUMENTS

| | | | | |
|---|---|---|---|---|
| 5,278,372 A * | 1/1994 | Takagi et al. | ............... | 200/344 |
| 6,068,416 A | 5/2000 | Kumamoto et al. | .... | 200/344 X |
| 6,100,482 A | 8/2000 | Koma et al. | ................ | 200/344 |
| 6,257,782 B1 | 7/2001 | Maruyama et al. | ..... | 200/345 X |

FOREIGN PATENT DOCUMENTS

| | | | |
|---|---|---|---|
| JP | 2001-052562 | 2/2001 | .......... H01H/13/14 |
| JP | 2001/167658 | 6/2001 | .......... H01H/13/14 |

* cited by examiner

*Primary Examiner*—J. R. Scott
(74) *Attorney, Agent, or Firm*—Staas & Halsey LLP

(57) ABSTRACT

A key switch includes a switch provided on a base, a key top for operating the switch, and a link mechanism supported on the base and supporting the key top on its upper side, a shape of the link mechanism being changed when the key top is depressed. A movable plate is provided on the base, in stacked relationship; such that the movable plate is moved when the key top is depressed so as to change the shape of the link mechanism to a flat shape. An auxiliary link mechanism has a first part supported on the moveable plate and, in turn, by the base and a second part supporting the key top.

9 Claims, 11 Drawing Sheets

KEY SWITCH AND KEYBOARD

BACKGROUND OF THE INVENTION

1. Field of the Invention

The present invention relates to a key switch and a keyboard provided with a plurality of key switches.

In order to improve portability of a portable apparatus, such as a notebook-type personal computer, provided with a keyboard, it is required to reduce thickness of the apparatus. Accordingly, it is required to reduce height of the keyboard which is built in the portable apparatus.

For operability of a key switch of such a keyboard, it is required that a key top moves smoothly, a stroke of the key top is greater than a predetermined distance and wobbliness of the key top is at its minimum. The wobbliness of the key top affects operability of key-stroking if the fingertip of the user presses a position near periphery of the key top. In such a case, the key top will be inclined and will be pressed down in an inclined state. The user then feels that the operability of the keyboard is not good.

2. Description of the Related Art

An exemplary key switch of the related art includes a key top, a housing and a dome-shaped rubber spring member. The key top includes a cylindrical part at its lower surface. The cylindrical part is fitted to a guide cylinder provided on the housing. The dome-shaped rubber spring member is mounted on the housing and presses up the key top. The key top moves vertically while being guided by the guide cylinder. It is difficult to reduce the height of such a key switch since the cylindrical part and the guide cylinder must be provided.

As an improved version of such a key switch, a key switch is known which includes a key top, a housing, an X-shaped link mechanism and a spring member. The link mechanism includes two linking members assembled in an X-shape. The link mechanism is provided on the housing. The key top is provided on an upper side of the link mechanism. The key top is supported by the link mechanism and moves in a vertical direction.

The key switch provided with such a link mechanism eliminates the need for a guiding mechanism for vertical movement of the key top since the link mechanism supports the key top. Therefore, the height of the key switch provided with link mechanism is reduced compared to the height of the key switch provided with the cylindrical part and the guide cylinder. However, further reduction of the height of the key switch is desired.

The notebook type personal computer is carried in such a state that a liquid crystal panel is folded against the keyboard. In order to improve portability, it is required to reduce the thickness of the notebook type personal computer in the folded state. Accordingly, the height of the key switch needs to be reduced only in a state where the liquid display panel is folded against the keyboard.

Based on this concept, the applicant has proposed an improved key switch having such a link mechanism in Japanese Patent Application No. 11-347887 titled "Key switch and a key board." This key switch is configured such that the key top is depressed when it is not in use.

FIG. 1 is an exploded diagram showing a key switch 10 of the related art. The key switch 10 includes a key top 20, an X-shaped link mechanism 30, a fixed base 40, a movable plate 50, a membrane switch sheet 60 and a supporting plate 70. The link mechanism 30 includes a first link 31 and second link 32 which are assembled in a crossed configuration. The first link 31 is provided with a leaf spring 33 fixed thereon. The link mechanism 30 is supported on the fixed base 40 and the key top 20 is held horizontally with four bearing parts 21 formed on its back surface being fitted with shaft parts at upper ends of the first and second links 31 and 32. The leaf spring 33 touches a lug part 51 of the movable plate 50. When the key top is pressed, for example by a fingertip, the first and second links 31 and 32 of the link mechanism 30 are pivoted to incline and the leaf spring member is flexed. When the fingertip is released from the key top 20, the first and second links 31 and 32 are pivoted to rise by a spring force of the leaf spring member 33. Thus, the key top 20 is lifted and moves back to its initial position.

When the movable plate 50 is moved in a Y1-direction, the first and second links 31 and 32 of the link mechanism 30 is pivoted to incline. The key top 20 moves downwards until it abuts the fixed base 40. This may be referred to as a depressed state of the key top. Thus, the key top 20 now has a reduced height.

However, since the first and second links 31 and 32 of the link mechanism 30 needs to be accommodated within a region defined by a projection of the key top 20 on the fixed base 40, the four shaft parts at the tip of the first and second links 31 and 32 are provided at proximate position to each other when in a raised position. Thus, the four parts supported by the four shafts at the tip of the first and second links 31 and 32 of the key top 20 are placed within a region near the central part of the key top 20. Accordingly, the key top 20 is supported at the portion near its center and thus is in a wobbly state.

SUMMARY OF THE INVENTION

Accordingly, it is a general object of the present invention to provide key switch and a key board having such key switches.

It is another and more specific object of the present invention to provide key switch and a key board having such key switches which can reduce the problems described above.

In order to solve the problems described above, a key switch is provided, which includes:

a switch provided on a base;

a key top for operating the switch;

a link mechanism supported on the base and supporting the key top on its upper side, a shape of the link mechanism being changed when the key top is depressed;

a movable plate provided on the base such that the movable plate is moved when the key top is depressed so as to change the shape of the link mechanism to the flat shape; and an auxiliary link mechanism having a first side part supported by the base and a second side part supporting the key top.

With the above-described key switch having an auxiliary link mechanism, wobbliness of the key top is reduced and thus feel of operation of a key-stroking operation can be improved. Also, since the link mechanism can change its shape to a flattened shape by moving the movable plate, the key top may be take its lowered position while the keyboard is not in use.

DETAILED DESCRIPTION OF THE PREFERRED EMBODIMENTS

In the following, principles and embodiments of the present invention will be described with reference to the accompanying drawings.

Figure 1:
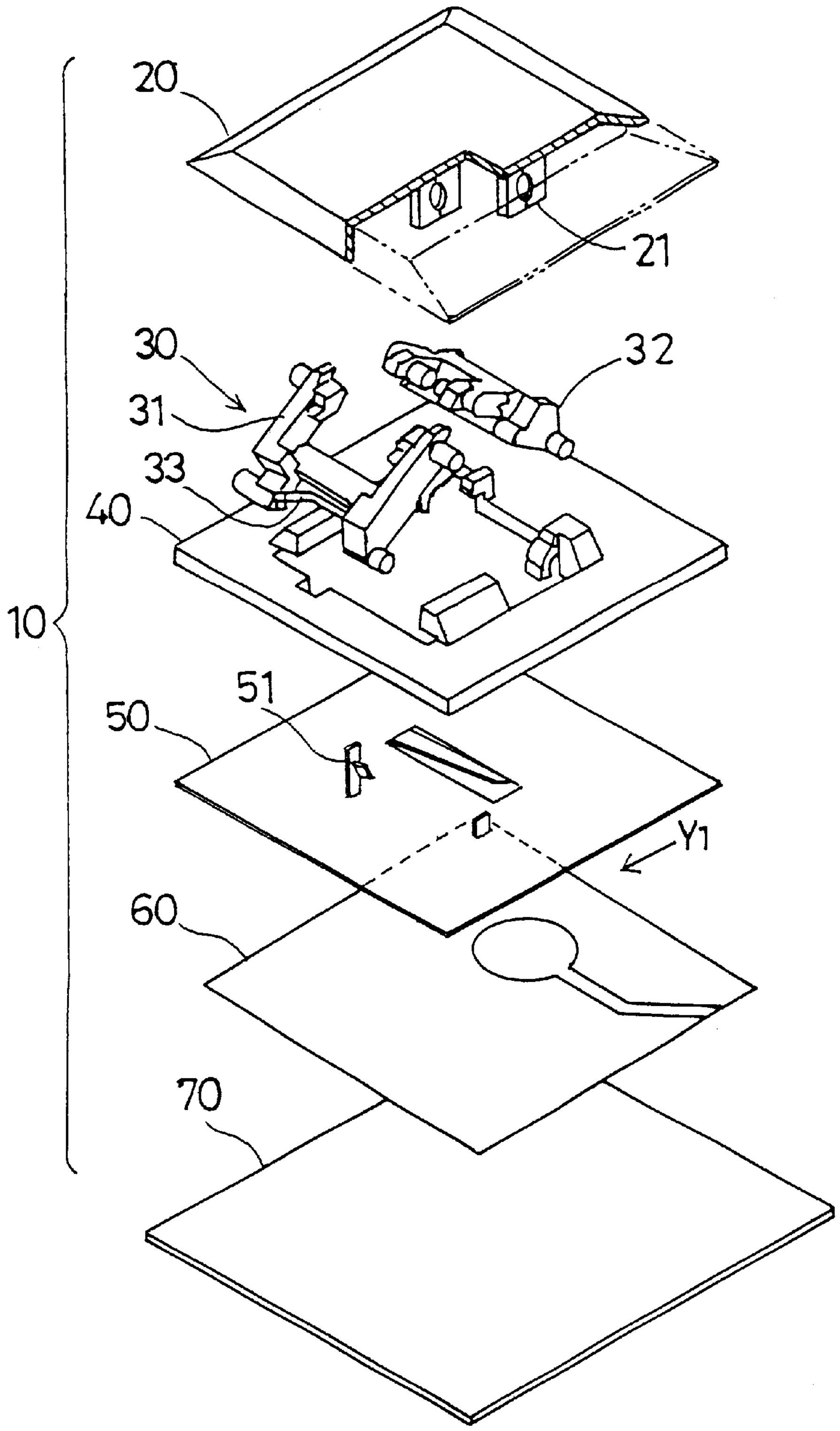
FIG. 1 PRIOR ART
FIG. 1 is an exploded perspective diagram of a key switch of the related art.
Figure 2:
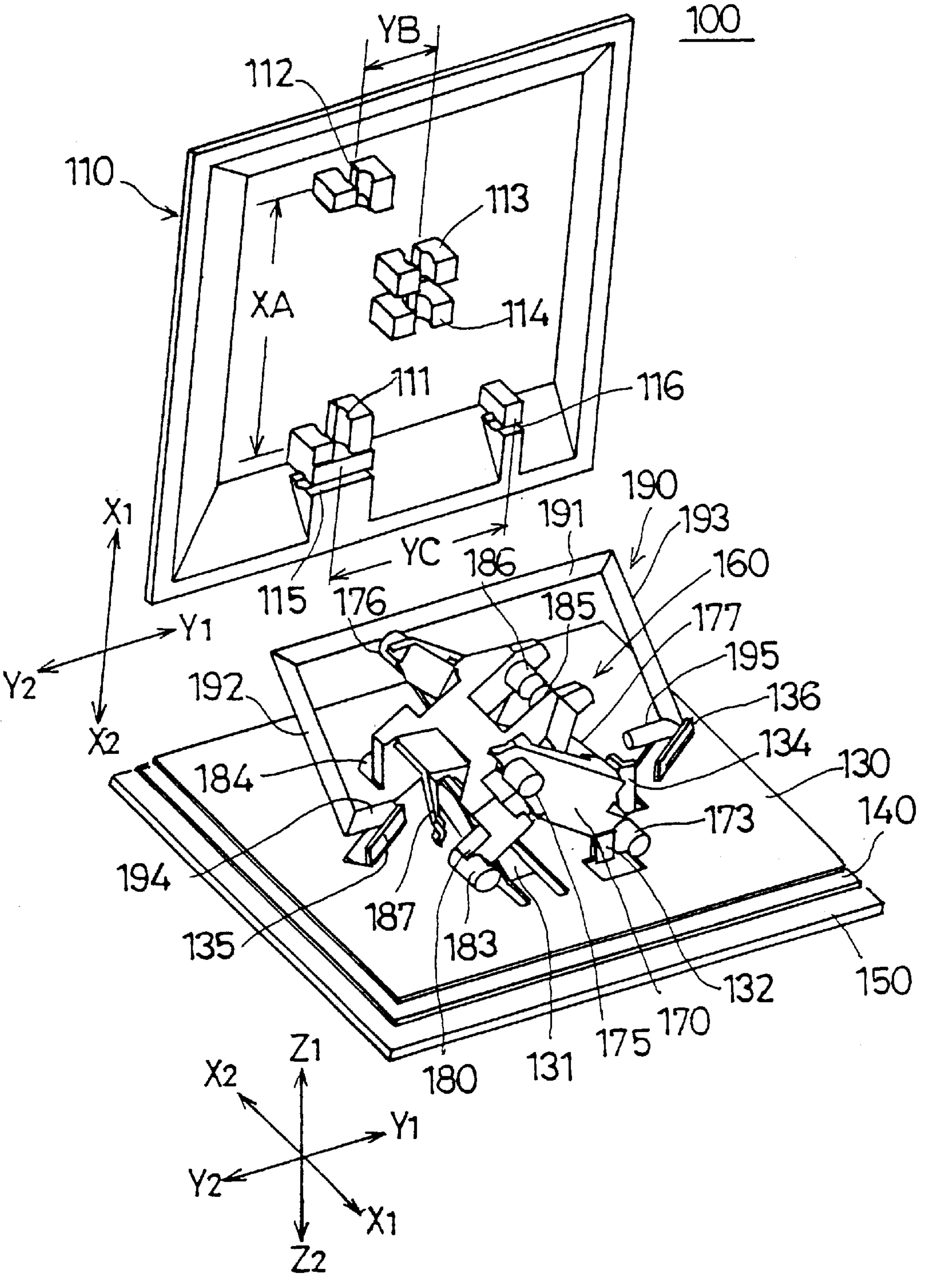
FIG. 2 is a perspective diagram showing the key switch of an embodiment of the present invention.
Figure 3:
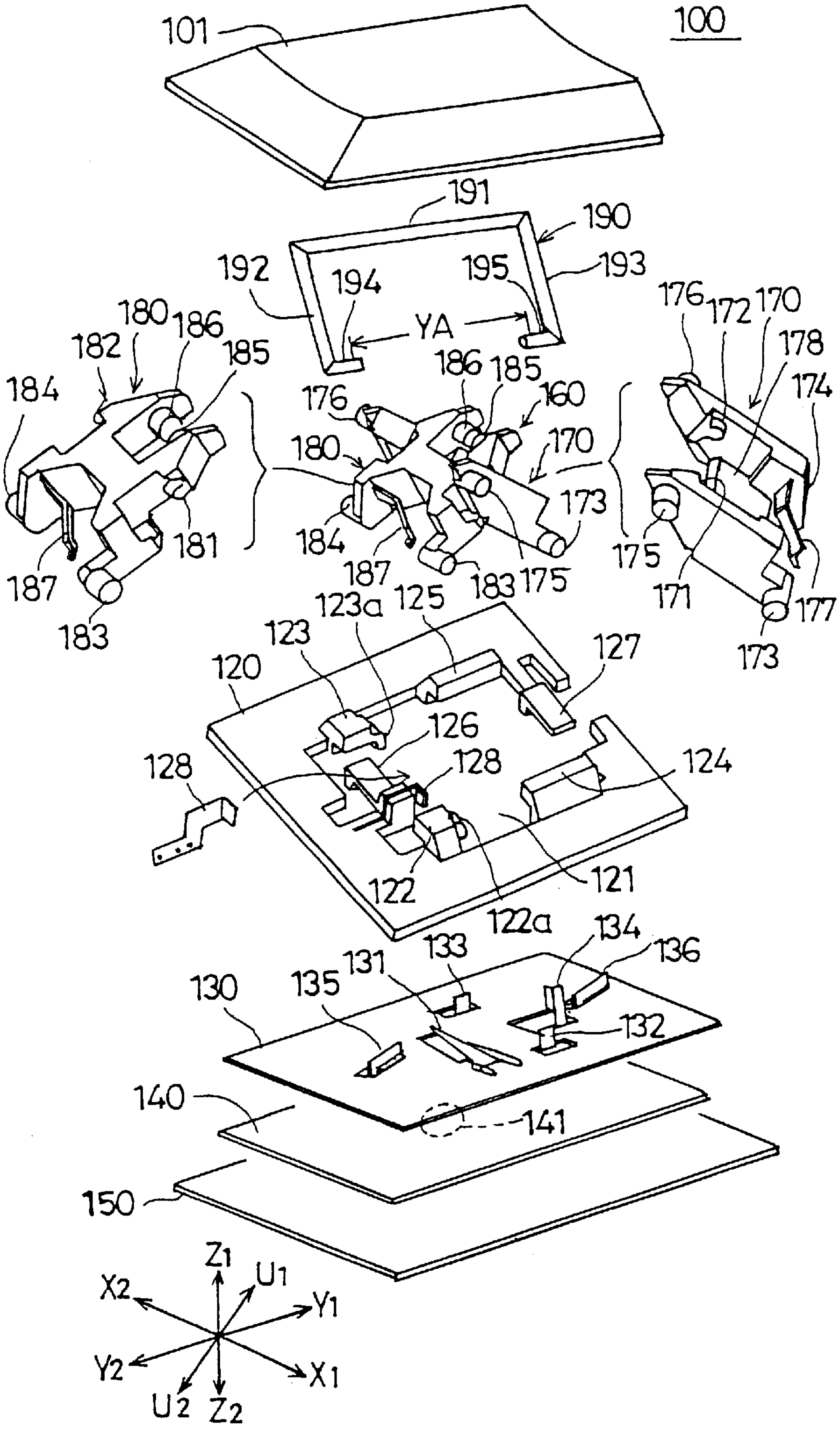
FIG. 3 is an exploded perspective diagram of the key top switch shown in FIG. 2.
Figure 4A:
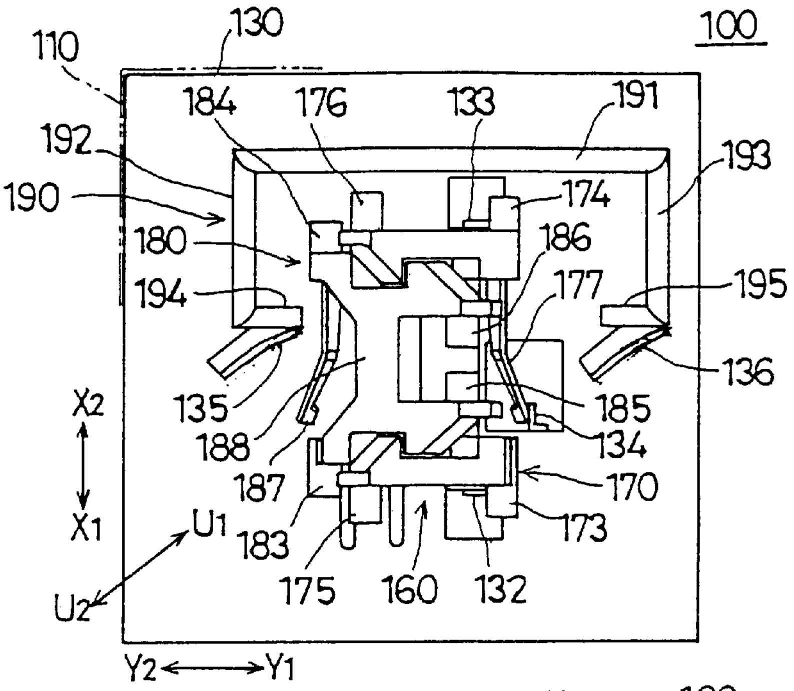
FIGS. 4A to 4C are diagrams showing the key switch of FIG. 2 in a state before operation.
Figure 4B:
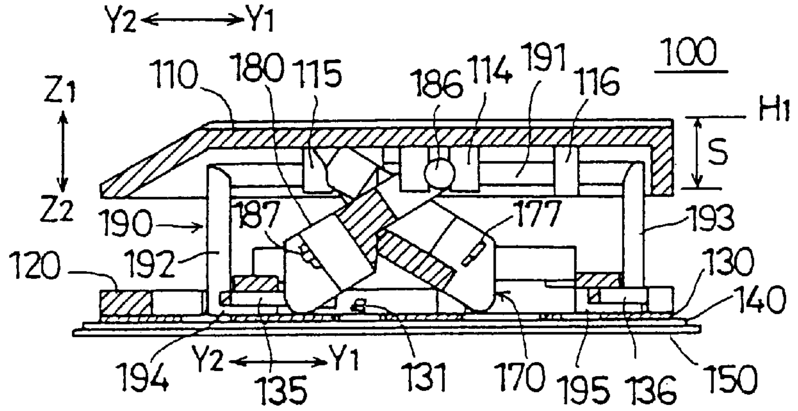
Figure 4C:
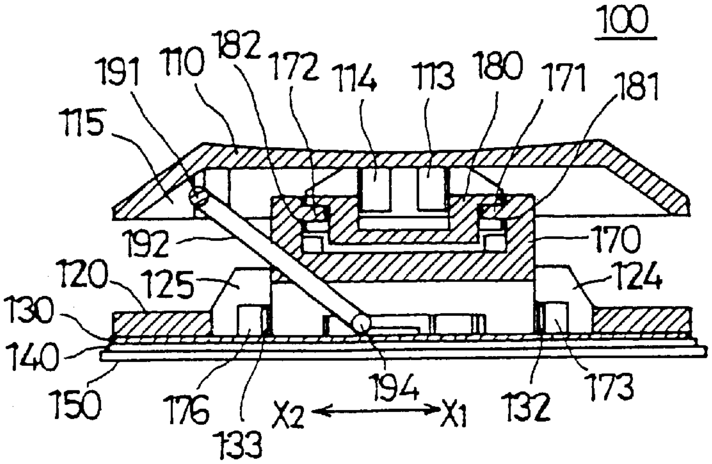

Firstly, a key switch of a first embodiment of the present invention will be described in detail. FIGS. 2 and 3 are exploded perspective diagrams of a key switch 100 of a first embodiment of the present invention. FIGS. 4A to 4C are diagrams showing the key switch 100 in a state before a key-stroke operation (initial state). In FIG. 2, a fixed base 120 is omitted for the sake of clarity. In the figures, an arrow Y2 points to an operator side of a keyboard 221 with key switches 100 (see FIG. 8) and an arrow Y1 points to a side remote from the operator. Arrows X1 and X2 show right and left directions viewed from the user, or, a width direction. Arrows Z1 and Z2 show a height direction. The arrow Z1 indicates an upward direction and the arrow Z2 indicates a downward direction.

The key switch 100 includes, from the upper side, a key top 110, the fixed base 120, a movable plate 130, a membrane switch sheet 140,and a supporting plate 150. An X-shaped link mechanism 160 and a substantially U-shaped auxiliary link mechanism 190, which is an essential part of the present invention, are provided between the fixed base 120 and the key top 110 and are supported on the supporting plate 150. The link mechanism 160 and the auxiliary link mechanism 190 are configured such that they are accommodated within a region defined by a projection of the key top 110 on the supporting plate 150.

The membrane switch sheet 140 is provided with a switch part 141 having a pair of contacts at the central part and is mounted on the supporting plate 150.

The movable plate 130 is movable in the Y1-direction. When the key switches 100 are assembled to the keyboard 221 of a notebook-type computer 210, the movable plate 130 moves in a manner described in detail with reference to FIG. 8. Briefly, the movable plate 130 moves in the Y1-direction when a liquid crystal display panel 230 is folded against the keyboard 221 to close notebook-type personal computer 210 and it moves in the Y2-direction when the liquid crystal display panel 230 is opened.

The movable plate 130 is a metal plate and is provided with an actuation member 131, a pair of lugs 132,133, a receiving member 134 and a pair of leaf springs 135,136. The actuation member 131 is placed above a switch part 141. The actuation member 131, the pair of lugs 132,133 and the receiving member 134 are associated with the link mechanism 160. The pair of leaf springs 135,136 is associated with the auxiliary link mechanism 190. As shown in FIG. 4A, the pair of leaf springs 135, 136 lies in a U1–U2 direction between X1–X2 direction and Y1–Y2 direction.

The U2-direction shows the base material part side and the U1-direction shows the free end side.

The fixed base 120 is a molded member made of synthetic resin and has an opening window 121 at the center. Link mechanism supporting parts 122, 123, 124 and 125 for supporting the link mechanism 160 are provided on the periphery of the opening window 121 along sides extending in the Y1-Y2 direction. Auxiliary link mechanism supporting parts 126 and 127 are provided on the periphery of the opening window 121 along sides extending in the X1–X2 direction. A receiving member 128 made of a metal piece is fixed near the auxiliary link mechanism supporting part 126.

The fixed base 120 and the movable plate 130 are provided in a stacked manner such that the upper surface of the movable plate 130 closes the opening window 121 while the actuation member 131, the pair of lugs 132, 133, the receiving member 134 and the pair of spring leafs 135, 136 protrude from the opening window 121. The link mechanism supporting parts 122, 123, 124 and 125 and the movable plate 130 forms a guide groove extending in the Y1–Y2 direction. The auxiliary link mechanism supporting parts 126, 127 and the movable part 130 forms a guide groove extending in the X1–X2 direction.

The link mechanism 160 is configured such that the first link 170 having an H-shape and a second link 180 having an H-shape are engaged at gear parts 171, 172 and gear parts 181, 182, respectively, in a crossed manner and thus forms an X-shape. When the first and second links 170, 180 are pivoted to incline, the link mechanism 160 becomes in a flat state. The first link 170 is provided with shaft parts 173 and 174 at the lower end and shaft parts 175 and 176 at the upper end. Also, the first link 170 is provided with a leaf spring member 177 fixed in a cantilevered manner which extends in the X1–X2 direction. The second link 180 is provided with shaft parts 183 and 184 at the lower end and shaft parts 185 and 186 at the upper end. Also, the second link 180 is provided with a leaf spring member 187 fixed in a cantilevered manner which extends in the X1–X2 direction. The engaging gear parts 171, 172 and the gear parts 181, 182 operate such that, when one of the first and second links 170 and 180 are pivoted in a certain direction, the other link is pivoted in an opposite direction, so that the first link 170 and the second link 180 incline and rise in the same manner.

The shaft parts 173, 174, 183 and 184 of the link mechanism 160 are fitted to the link mechanism supporting members 124, 125, 122 and 123, respectively, and their movements are restricted in the Z1–Z2 direction and in the X1–X2 direction but are movable in the Y2-direction and are pivotable. The shaft parts 173 and 174 are situated on the Y1-side of the lugs 132 and 133, respectively. Also, movements of the shaft parts 183 and 184 in the Y1-direction are restricted by stopper parts 122*a* and 123*a* protruding in the Z2-direction on the Y1-side of the link mechanism supporting members 122 and 123.

The free end of the spring leaf member 187 abuts the receiving member 128 and the free end of the spring leaf member 177 abuts the receiving member 134. The second link 180 is provided with a pressing part 188 for pressing the actuation member 131.

The substantially U-shaped auxiliary link mechanism 190 is made of a metal rod having a circular cross-section and having a diameter which is not easily deformable. The auxiliary link mechanism 190 includes a long transverse rod part 191, arm parts 192 and 193 on both ends of the transverse rod part 191 and shaft parts 194 and 195 extending inwardly from the tips of the arm parts 192 and 193.

The shaft parts 194 and 195 are fitted to the auxiliary link mechanism supporting parts 126 and 127, respectively, and their movements are restricted in the Z1–Z2 direction and in the Y1–Y2 direction but are movable in the X1–X2 direction and are pivotable.

The shaft parts 194 and 195 are separated in the Y1–Y2 direction by a considerably long distance YA. The shaft parts 194 and 195 abut the leaf springs 135 and 136, respectively.

As shown in FIG. 2, the shaft parts 111, 112, 113, 114 corresponding to the shaft parts 175, 176, 185, 186 of the link mechanism 160 and the shaft parts 115, 116 corresponding to the transverse rod part 191 of the auxiliary link mechanism 190 are provided on the lower surface of the key top 110. In the X1–X2 direction, the shaft part 111 and the shaft part 112 are separated by a considerably long distance XA. In the Y1–Y2 direction, the shaft parts 111, 112 and the shaft parts 113, 114 are separated by a considerably short distance YB. In the Y1–Y2 direction, the shaft part 115 and the shaft part 116 are separated by a distance YC, which is approximately double the distance YB.

The key top 110 is held horizontally with the bearing parts 111, 112, 113 and 114 fitted to the shafts 175, 176, 185 and 186 and the bearing parts 115, 116 fitted to the transversal-rod part 191. The shafts 175, 176, 185 and 186 are rotatable in the bearing parts 111, 112, 113 and 114, respectively. The transversal rod part 191 is rotatable in the bearing parts 115 and 116.

As shown in FIGS. 4A and 4C, the transversal rod part 191 of the auxiliary link mechanism 190 extends along the X2-side edge of the key top 110.

Also, the auxiliary link mechanism 190 and the link mechanism 160 are situated such that an operation of the auxiliary link mechanism 190 does not interfere with an operation of the link mechanism 160.

In the following, the key switch 100 of the above-described structure will be described for a state before operation.

Before operation, the key switch 100 is in the state shown in FIGS. 4A, 4B and 4C. The movable plate 130 has been moved in the Y2-direction, and therefore, the gap between the receiving member 134 and the receiving member 128 is reduced and the leaf spring members 177 and 187 are pressed such that the first and second links 170 and 180 are raised. The key top 110 is situated at a higher level H1 in a horizontal manner. The actuation member 131 is situated directly above the switch part 141.

The key top 110 is supported by the link mechanism 160 and is also supported by the auxiliary link mechanism 190. Thus the wobbliness of the key top 110 is reduced.

Now, it is described how the wobbliness of the key top 110 is reduced in accordance with the present invention.

1. Structure related to the link mechanism i) The positions of the shaft parts 183 and 184 of the second link 180 are restricted in the X1–X2 direction and the Z1–Z2 direction. In the Y1–Y2 direction, in which the shaft parts 183 and 184 are allowed to move, the shaft parts 183 and 184 are pressed against the stopper parts 122*a* and 123*a* by the spring force of the leaf spring member 187. Accordingly, the second link 180 is held above the fixed base 120 in a stable manner without wobbliness.

ii) The positions of the shaft parts 173 and 174 of the first link 170 are restricted in the X1–X2 direction and Z1–Z2 direction. In the Y1–Y2 direction, in which the shaft parts 173 and 174 are allowed to move, the shaft parts 173 and 174 are pressed against the lugs 132 and 133 by the spring force of the leaf spring member 177. Accordingly, the first link 170 is held above the fixed base 120 in a stable manner without wobbliness.

2. Structure related to the auxiliary link mechanism 190 i) The auxiliary link mechanism 190 is rigid and does not flex.

ii) The shaft parts 194 and 195 are provided at a considerably long distance YA, and two positions at which the auxiliary link mechanism 190 are supported by the fixed base 120 are separated apart.

iii) The positions of the shaft parts 194 and 195 are restricted in the Y1–Y2 direction and Z1–Z2 direction. In the X1–X2 direction, in which the shaft parts 194 and 195 are allowed to move, the shaft parts 194 and 195 are pressed against the leaf springs 135, 136 such that the leaf springs 135, 136 are flexed. The shaft parts 194 and 195 operate with the spring forces exerted by the leaf springs 135, 136, respectively. Accordingly, the auxiliary link mechanism 190 is held above the fixed base 120 in a stable manner without wobbliness.

iv) In the Y1–Y2 direction, the bearing parts 115 and 116 are separated by a considerably long distance YC.

Since the wobbliness of the key top 110 is reduced in a manner described above, the key top 110 is prevented from being inclined even if a portion near the corner of the key top 11 is pressed by the fingertip. Therefore, even if key top 110 is pressed by the finger at a portion near the corner of the key top 110 during a key-stroke operation of the key top 110, the key top 110 will not be inclined and is lowered in a horizontally held state. Thus, the ease of use of the key switch 100 is increased.

This also applies in a case where the key top 110 moves in the Z2-direction by a key-stroke operation. Accordingly, the key top 110 remains in its horizontally situated manner while the key top 110 moves in the Z2-direction by the key-stroke operation.

Now, an operation of such a key switch 100 will be described.

Figure 5A:
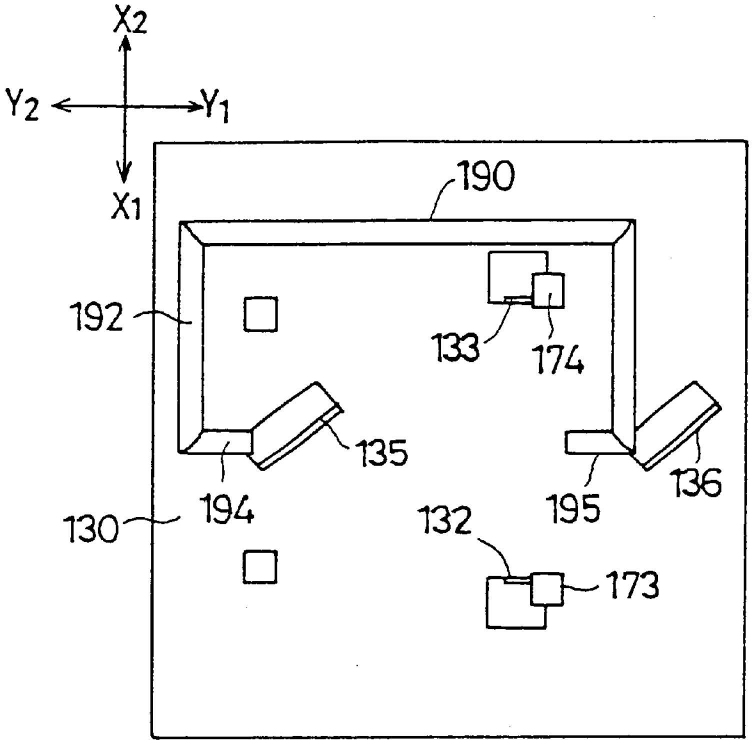
FIGS. 5A to 5C are diagrams showing the key switch of FIG. 2 in a state where the key top is at its depressed position.
Figure 5B:
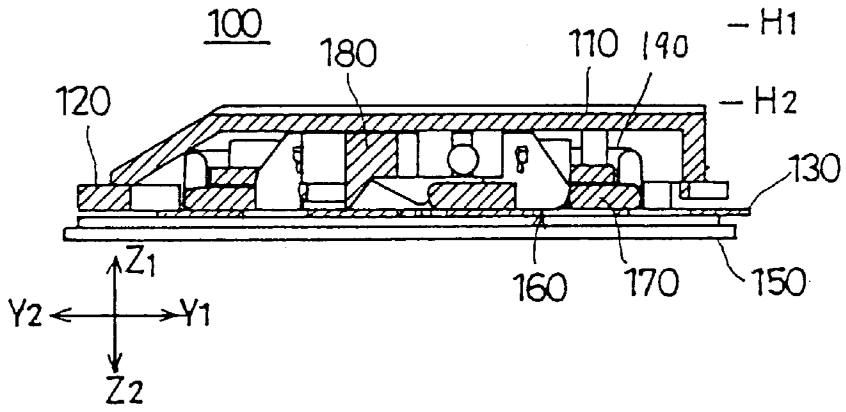
Figure 5C:
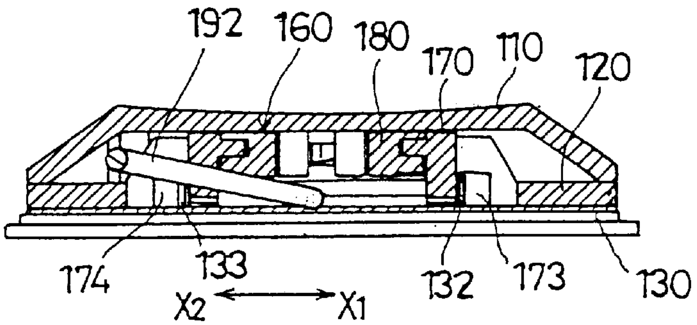

[Operation of lowering the key top 110] (see FIGS. 5A, 5B and 5C).

The movable plate 130 is moved in the YI-direction. When the movable plate 130 is moved in the YI-direction, the key top 110 changes from the state shown in FIGS. 4A to 4C to a state shown in FIGS. 5A to 5C. Thus, the key top 110 is lowered and reaches an unused level H2.

That is to say, when the movable plate 130 is moved in the, Y1-direction, the distance between the receiving member 134 and the receiving member 128 are widened. Also, the lugs 132 and 133 presses the shaft parts 173 and 174, respectively, and force them to move in the Y1-direction.

When the shaft parts 173 and 174 are forced in the Y1-direction, the first link 170 pivots in direction such that they are inclined about the shaft parts 175 and 176. Since the displacement of the shaft parts 183 and 184 are restricted in the Y1-direction by the stoppers 122*a* and 123*a,* the second link 180 is pivoted to incline with the positions of the shafts 183 and 184 being maintained. That is to say, the link mechanism 160 changes its shape in a closed down shape with the positions of the shaft parts 183 and 184 being maintained. Thus, as shown in FIGS. 5B and 5C, the key top 110 gradually changes its shape in the Y1-direction and lowers in the Z2-direction until it abuts the fixed base 120. Thus, the key top 110 will be held at the unused-level H2.

When the movable plate 130 moves in the Y1-direction, the actuation member 131 becomes offset from the switch part 141. Thus, the switch part 141 will not be brought to its ON-state.

As for the auxiliary link mechanism 190, when the movable plate 130 is moved in the Y1-direction, as shown in FIG. 5A, the leaf springs 135 and 136 will be separated from the shafts 194 and 195, so as to enable the X1-direction movement of the shaft parts 194 and 195. Therefore, when the key top 110 is moved in a downward direction, the shaft parts 194 and 195 are moved in the X1-direction and the auxiliary link mechanism 190 inclines as shown in FIG. 5C. That is to say, the auxiliary link mechanism 190 does not restrict the downward movement of the key top 110.

[Operation upon key-stroking the key top 110]

Figure 6A:
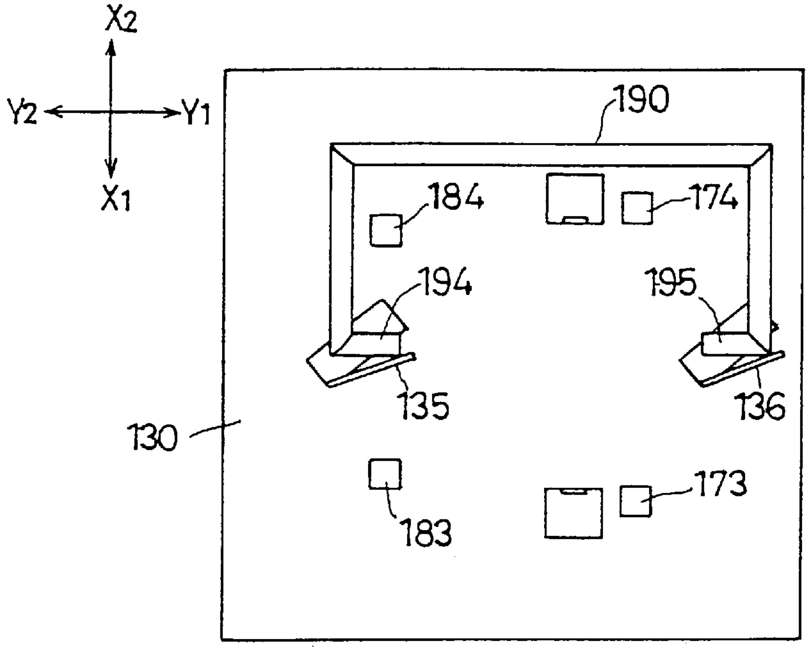
FIGS. 6A to 6C are diagrams showing the key switch of FIG. 2 in a state during a key-stroke operation.
Figure 6B:
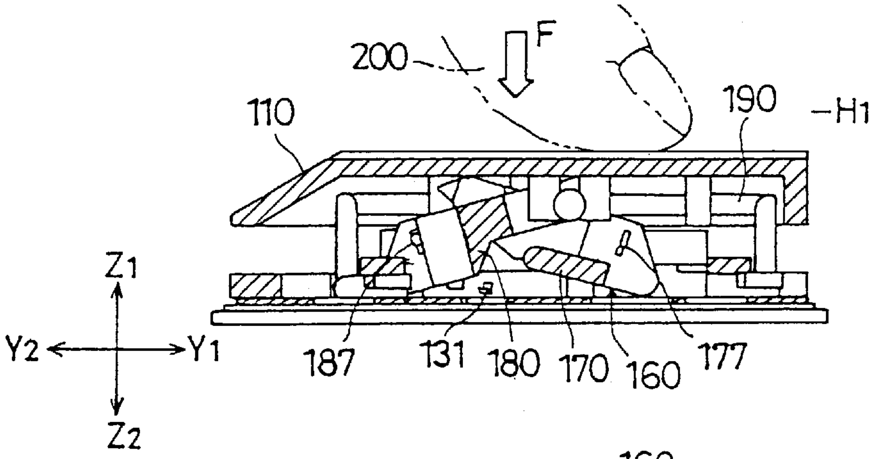
Figure 6C:
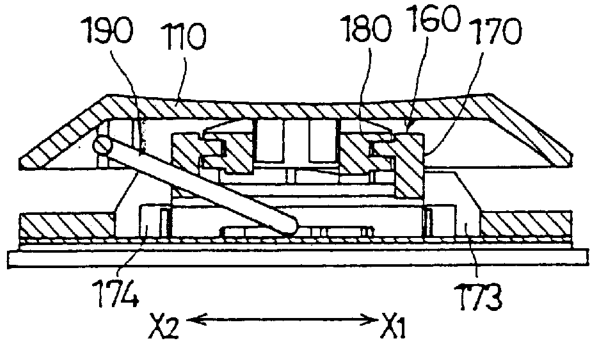
Figure 7A:
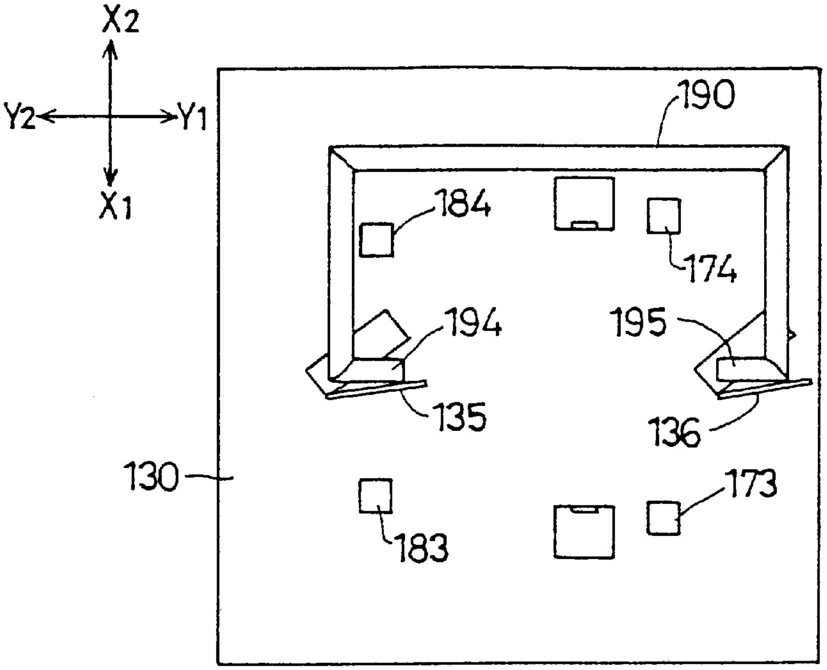
FIGS. 7A to 7C are diagrams showing the key switch of FIG. 2 in a state after the key-stroke operation.
Figure 7B:
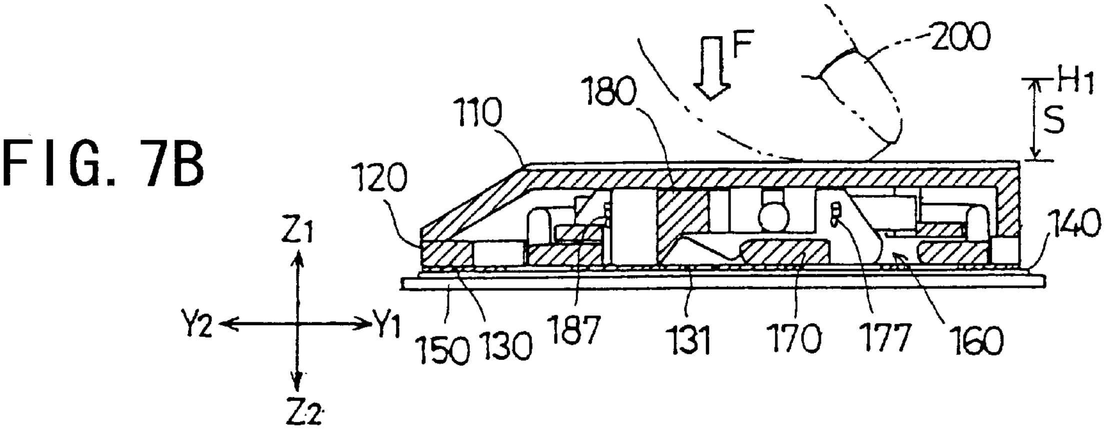
Figure 7C:
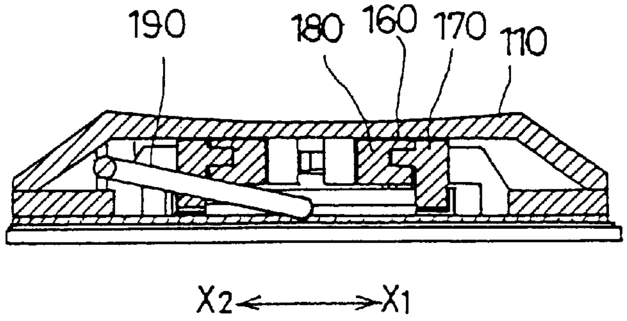

When the key top 110 is pressed by a fingertip 200,the key switch 100 changes from a state shown in FIGS. 4A to 4C to a state shown in FIGS. 6A to 6C and finally to a state shown in FIGS. 7A to 7C. Thus, the switch part 141 is turned ON. The key top 110 has a stroke S.

When the key top 110 is pressed by the fingertip 200, the pressing force will be exerted on the link mechanism and the auxiliary link mechanism 190. The shaft parts 173, 174 are moved in the Y1-direction and the shaft parts 183, 184 are moved in the Y2-direction, so that the link mechanism 160 is pivoted in a similar manner such that the first link 170 and the second link 180 flex the leaf spring members 177 and 187, respectively. The shaft parts 194 and 195 are moved and inclined in the X1-direction while the shaft parts 194 and 195 flex the leaf springs 135, 136, respectively. The key top 110 is lowered.

The key switch 100 reaches a state shown by FIGS. 6A to 6C. The switch 100 finally reaches the state shown in FIGS. 7A to 7C where the pressing part 199 presses the actuation member 131 which in turn presses the switching part 141 such that the switch part 141 is turned on.

When the fingertip 200 is released from the key top 110, the key switch 100 returns to its initial state shown in FIGS. 4A to 4C via the state shown in FIGS. 6A to 6C due to the spring forces of the leaf spring members 177, 187 and the leaf spring members 135, 136.

Now, since the wobbliness of the key top 110 is reduced, the key-stroke operation can be implemented with improved touch-and-feel property.

The following description relates to a keyboard having the above-described key switches 100 and a notebook-type personal computer having such a keyboard.

Figure 8:
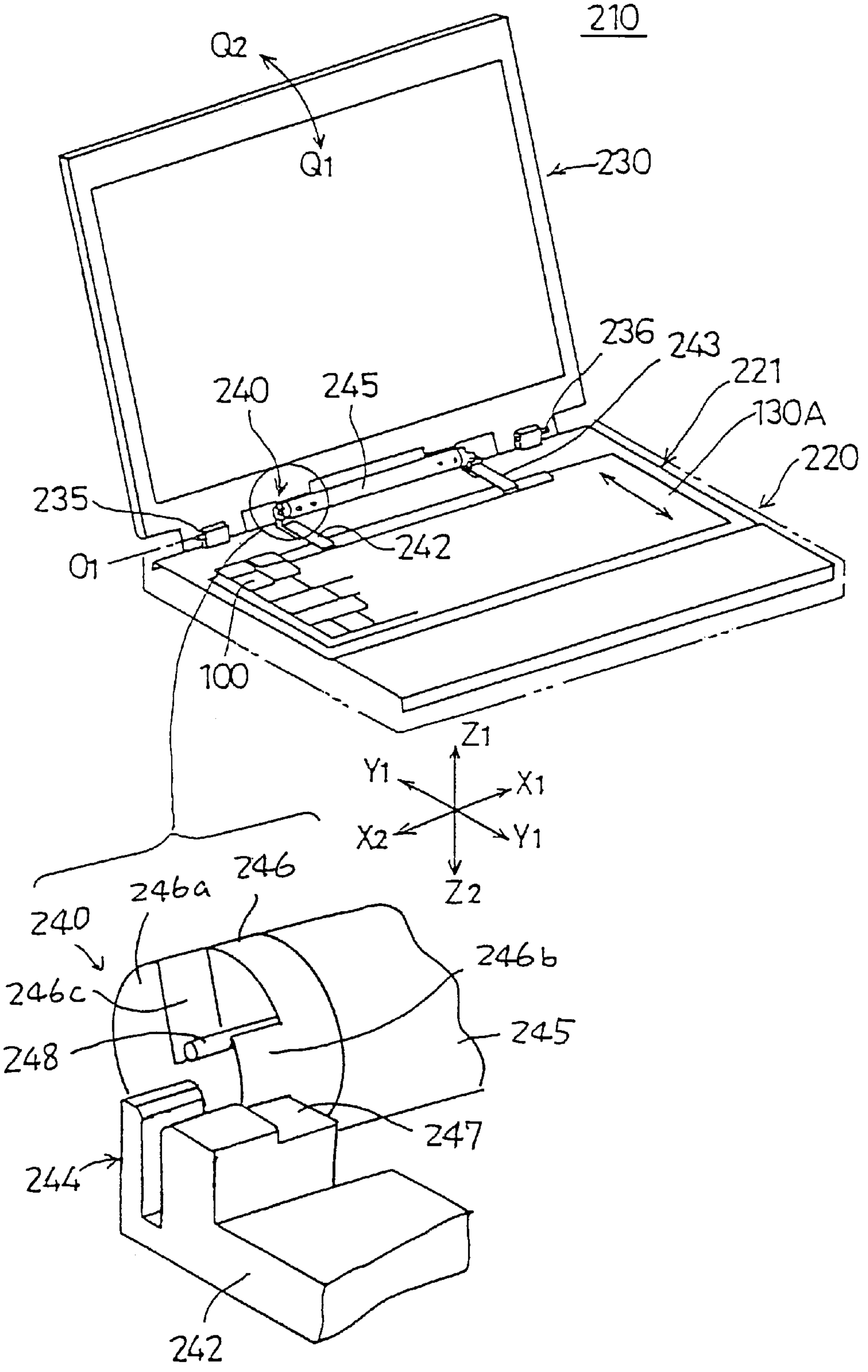
FIG. 8 is a diagram showing a notebook-type personal computer having key switches shown in FIG. 2.

As shown in FIG. 8, a notebook-type personal computer 210 includes a main body part 220 and a liquid crystal display panel 230 pivotably supported at hinges 235 and 236.

The main body 220 is provided with a keyboard 221. The keyboard 221 is provided with a plurality of arrays of the above-described key switches 100.

Each of a fixed base, a movable plate, a membrane switch sheet and a supporting plate has a size corresponding to the size of the key board 221 and is provided with a configuration shown in FIG. 2 at a part corresponding to each of the key tops 110.

An interlocking mechanism 240 for moving the movable plate 130A in an interlocked manner with an open-close operation of the liquid display panel 230 is provided between the liquid display panel 230 and the main body part 220.

The interlocking mechanism 240 is provided with two arm parts 242, 243 extending in the Y1-direction from the movable plate 130A. The liquid display panel 230 is provided with a cylindrical part 245 provided between a hinge 240 and a hinge 241.

As shown in an enlarged view of FIG. 8, a U-shaped hook part 244 and a block part 247 are formed at the tip part of each of the arm parts 242 and 243. A center O2 of the cylindrical part 245 coincide with an axis O1 for opening and closing the liquid display panel 230. A cylindrical bracket member 246 having a radius R is provided on each end of the cylindrical part 245. Reference numeral 246*a* indicates an end surface of the bracket member 246, reference numeral 246*b* indicates a peripheral surface of the bracket member 246 and reference numeral 246*c* indicates a fan-shaped recess formed in the bracket member 246. The bracket member 246 is provided with a pin 248 formed on the end of its recess 246*c*. The pin 248 protrudes from the end surface 246*a* and moves along an arc of a circle having a center O2 and a radius R corresponding to the opening and closing operations of the liquid display panel 230. Also, the hook part 244 opposes the end surface 246*a* of the bracket member 246 and the block part 247 opposes the peripheral surface 246*b* of the bracket member 246.

Figure 9:
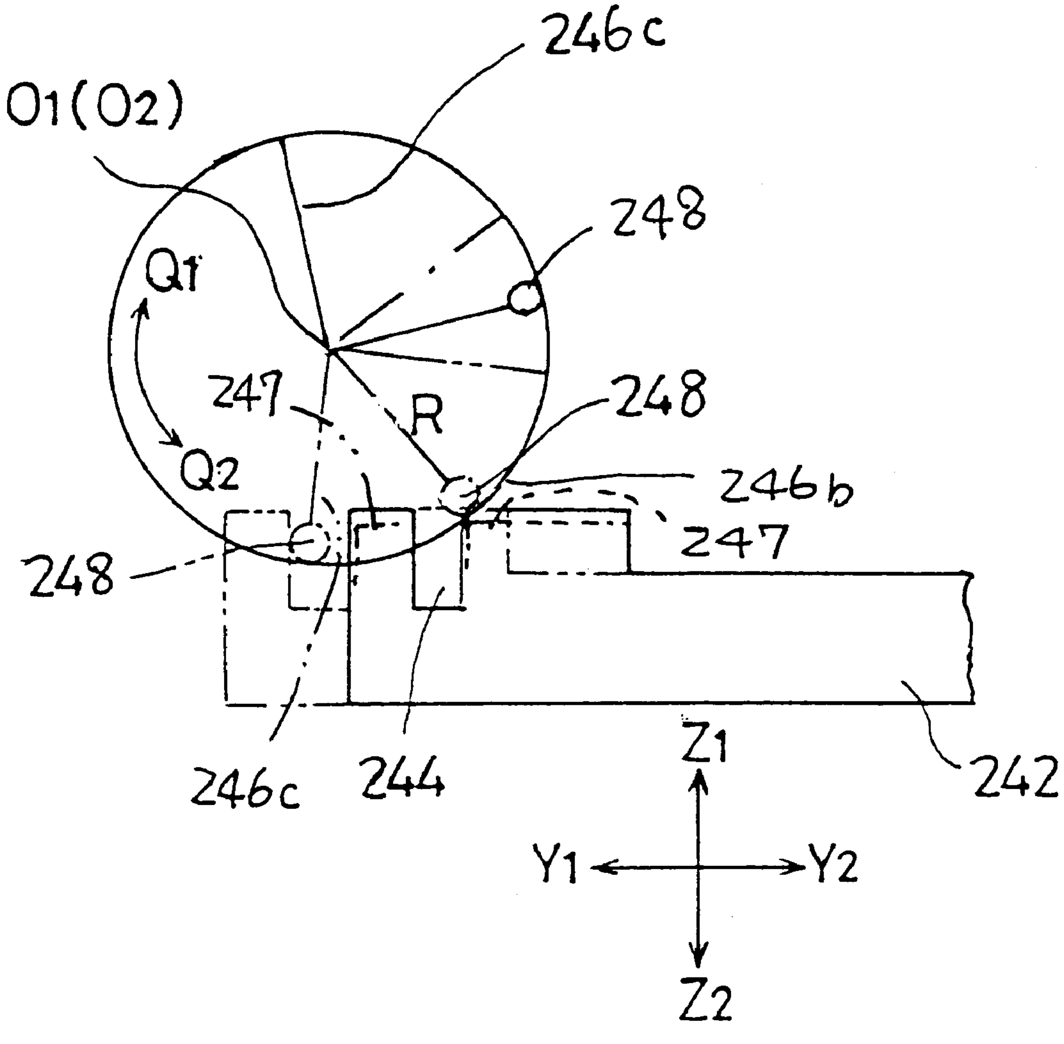
FIG. 9 is a diagram showing how an opening and closing operation of a liquid crystal display panel and movement of a movable plate are interlocked.

When the liquid display panel 230 is pivoted in the Q1-direction to its closed position and overlaps on the keyboard 221, the pin 248 engages with the hook part 244 as shown by the double-dashed line in FIG. 9, the block part 247 engages with the recess 246*c* and the movable plate 130A is moved in the Y1-direction. Each key switch 100 of the keyboard 221 is in a state where the key top 110 is in the lowered state as shown in FIG. 5. Thus, the thickness of the main body 220 is reduced by an amount corresponding to the stroke of the key top 110. Accordingly, the thickness of the notebook-type personal computer 210 is reduced by an amount corresponding to the stroke S of the key top 110.

When using the notebook-type personal computer 210, the liquid crystal display panel 230 is opened by raising and pivoting it in a Q2-direction. Then, the pin 248 presses the hook part 244, the movable plate 130A moves in the Y2-direction and the key top 110 hops up such that each of the key switches 100 of the keyboard 221 changes to the state shown in FIGS. 4A to 4C since.

When the liquid crystal display panel 230 is pivoted through an angle greater than a predetermined angle, the pin 248 disengages the hook part 244 and the peripheral surface 246*b* of the bracket member 246 secures the block 247. When the liquid crystal display panel 230 is in an open state, the block part 247 abuts the peripheral surface 246*b* of the bracket member 246. Accordingly, the movable plate 130A is locked and its Y1-direction movement is restricted.

After using the notebook-type personal computer 210, liquid crystal display panel 230 is pivoted in the Q1-direction and is brought to a closed position. The pin 246 engages with the hook part 244 and the block part 247 enters the recess 246*c*. Then the movable plate 130A moves in the Y1-direction. Each of the key top 110 of the key switch 100 of the keyboard 221 is lowered and becomes a state shown in FIGS. 5A to 5C.

In other words, in order to open the liquid crystal display panel 230, the movable plate 130A completes its movement at an initial step for opening the liquid crystal display panel 230 and the hop-up operation of the key top 110 is completed before the keyboard 221 is exposed. In order to close the liquid crystal display panel 230, the movable plate 130A is moved at a final stage of closing the liquid crystal display panel 230. The lowering of the key top 110 starts after the keyboard 221 has been covered by the liquid crystal display panel 230. Accordingly, the hop-up operation and the lowering operation of the key top 110 is not noticeable to the user.

[Variants]

A variant of the auxiliary link mechanism 190 will be described.

Figure 10:
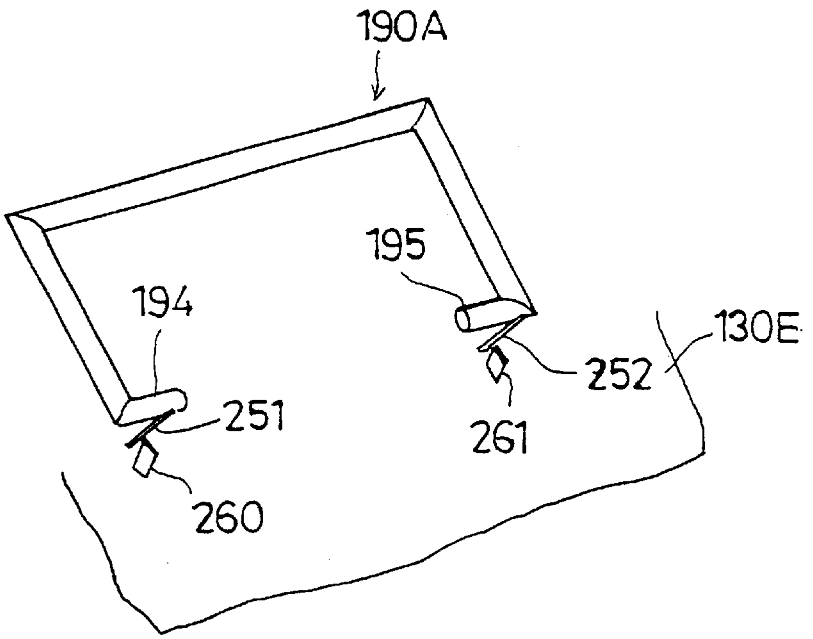
FIG. 10 is a diagram showing a variant of an auxiliary link mechanism.

FIG. 10 shows an auxiliary link mechanism 190A having shaft parts 194 and 195 provided with the leaf spring members 250 and 251. When the auxiliary link mechanism 190A is used, the leaf springs 135 and 136 on the movable plate 130 may be dispensed with. Instead of the leaf springs 135 and 136, the movable plate 130E may be provided with lugs 260 and 261 formed by cutting and raising.

Now, variants of the leaf springs 135 and 136 of the movable plate 130 will be described.

Figure 11:
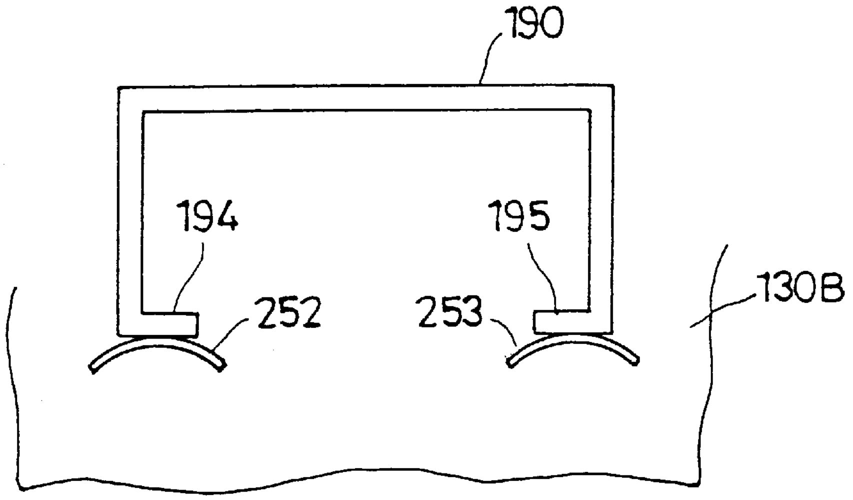
FIG. 11 is a diagram showing a first variant of a leaf spring of a movable plate.

FIG. 11 shows a movable plate 130B having arc-like leaf springs 252 and 253.

Figure 12:
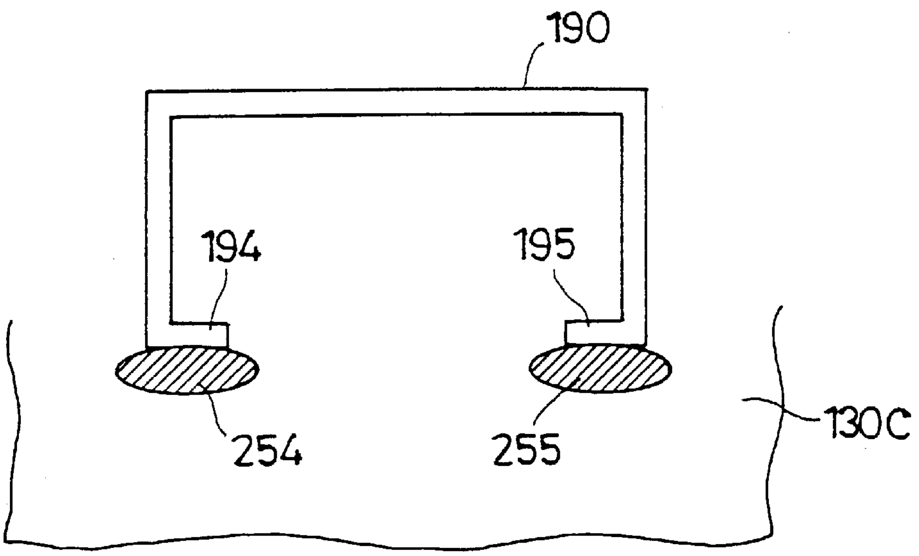
FIG. 12 is a diagram showing a second variant of a leaf spring of a movable plate.

FIG. 12 shows a movable plate 130C having receiving parts 254 and 255 made of sponge. The receiving parts 254 and 255 are elastically deformable and produce a repulsive force.

Figure 13:
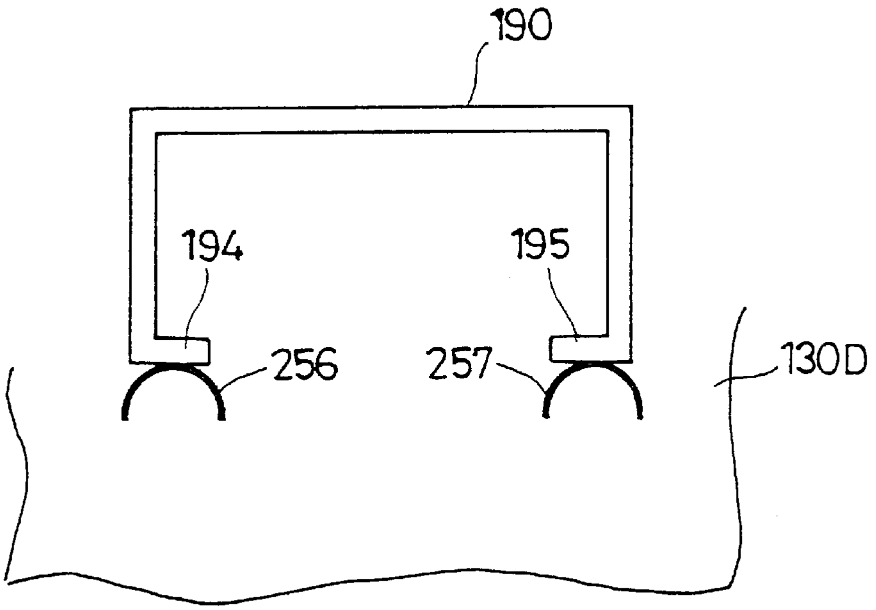
FIG. 13 is a diagram showing a third variant of a leaf spring of a movable plate.

FIG. 13 shows a movable plate 130D having receiving parts 256 and 257 made of rubber. The receiving parts 256 and 257 are elastically deformable and produce a repulsive force.

Further, the present invention is not limited to these embodiments, and variations and modifications may be made without departing from the scope of the present invention.

The present application is based on Japanese priority application No. 2001-172935 filed on Jun. 7, 2001, the entire contents of which are hereby incorporated by reference.

What is claimed is:

1. A key switch comprising:

a switch provided on a base;

a key top for operating said switch;

a link mechanism supported on said base and supporting said key top on its upper side, a shape of said link mechanism being changed when said key top is depressed;

a movable plate provided on said base such that said movable plate is moved when said key top is depressed so as to change the shape of said link mechanism to said flat shape; and an auxiliary link mechanism having a first side part supported by said base and a second side part supporting said key top.

2. The key switch as claimed in claim 1, wherein said movable plate includes an elastically deformable part which abuts said first side part of said auxiliary link mechanism, elastically deforms and exerts a force on said first side part of said auxiliary link mechanism, wherein, when said movable plate is moved, said elastically deformable part separates from said first side part of said auxiliary link.

3. The key switch as claimed in claim 1, wherein said auxiliary link mechanism includes a transversal rod part extending transversally of the key top; arm parts provided on both ends of said transverse rod part; and shaft parts extending inwardly from tips of said arm parts, said first side part of said auxiliary link mechanism corresponds to said shaft parts; and said second side part of said auxiliary link mechanism corresponds to said transversal rod part.

4. The key switch as claimed in claim 3, wherein said movable plate includes an elastically deformable part which abuts said shaft of said auxiliary link mechanism, elastically deforms and exerts a force on said shaft of said auxiliary link mechanism, wherein, when said movable plate is moved, said elastically deformable part separates from said shaft of said auxiliary link.

5. The key switch as claimed in claim 4, wherein said elastically deformable part of said movable plate is a leaf spring made integral with said movable plate by press-machining said movable plate.

6. The key switch as claimed in claim 3, wherein said auxiliary link includes leaf springs on said shafts and said leaf springs are elastically deformed by a part of said movable plate.

7. The key switch as claimed in claim 3, wherein said key top includes a plurality of link mechanism bearing parts for supporting upper ends of said link mechanism and transversal rod bearing parts for supporting said transversal rod of said auxiliary link mechanism, wherein, along a longitudinal direction of said transverse rod part, said transversal rod bearing parts are provided at outer positions comparing to positions of said link mechanism bearing parts.

8. A keyboard comprising a plurality of key switches as claimed in claim 1.

9. A notebook-type computer comprising:

a main body part provided with a keyboard as claimed in claim 8;

a liquid crystal display panel supported on said main body part by hinges so as to be movable between an open position and a closed position; and an interlocking mechanism for moving said movable plate in an interlocked manner with a closing operation of said liquid crystal panel such that said linking mechanism changes its shape to a flat shape and in an interlocked manner with an opening operation of said liquid crystal panel such that said movable plate is moved in an opposite direction and said linking mechanism changes its shape to an initial shape.

* * * * *